(12) United States Patent
Chen

(10) Patent No.: US 7,791,398 B2
(45) Date of Patent: Sep. 7, 2010

(54) LEVEL SHIFT CIRCUIT

(75) Inventor: Chung-chun Chen, Hsin-Chu (TW)

(73) Assignee: Au Optronics Corp., Hsin-Chu (TW)

( * ) Notice: Subject to any disclaimer, the term of this patent is extended or adjusted under 35 U.S.C. 154(b) by 0 days.

(21) Appl. No.: 12/348,476

(22) Filed: Jan. 5, 2009

(65) Prior Publication Data
US 2009/0278586 A1 Nov. 12, 2009

(30) Foreign Application Priority Data
May 9, 2008 (TW) ............................... 97117258 A

(51) Int. Cl.
*H03L 5/00* (2006.01)
(52) U.S. Cl. .............................. 327/333; 326/62; 326/81
(58) Field of Classification Search ............. 326/62–63, 326/80–81; 327/306, 333
See application file for complete search history.

(56) References Cited
U.S. PATENT DOCUMENTS

| 6,633,192 | B2 | 10/2003 | Tsuchiya |
| 6,696,858 | B2 | 2/2004 | Tokai |
| 6,741,230 | B2 | 5/2004 | Sakai et al. |
| 6,853,221 | B1 * | 2/2005 | Wert ........................... 327/143 |
| 6,922,095 | B2 | 7/2005 | Chiu |
| 7,511,554 | B2 * | 3/2009 | Kaneko et al. ............... 327/333 |
| 7,560,974 | B2 * | 7/2009 | Noh et al. ..................... 327/534 |
| 2003/0137336 | A1 | 7/2003 | Okamoto et al. |
| 2008/0117237 | A1 | 5/2008 | Saito et al. |

FOREIGN PATENT DOCUMENTS

| CN | 1532798 A | 9/2004 |
| TW | 580793 | 3/2004 |

* cited by examiner

*Primary Examiner*—Dinh T. Le
(74) *Attorney, Agent, or Firm*—Kirton & McConkie; Evan R. Witt

(57) ABSTRACT

A level shift circuit for adjusting voltage level of an input signal includes a voltage dividing circuit coupled to a input terminal for outputting a first voltage signal in response to the input signal at the input terminal, and a buffer coupled to a first node for generating a second voltage signal by adjusting voltage level of the first voltage signal. The voltage dividing circuit includes a first load coupled between the first node and the first supply voltage, and a second load coupled between the input terminal and the first node.

7 Claims, 11 Drawing Sheets

LEVEL SHIFT CIRCUIT

BACKGROUND OF THE INVENTION

1. Field of the Invention

The present invention relates to a level shift circuit, and more specifically, to a level circuit with low sensitivity to a threshold voltage and adapted to be operated under low input voltage.

2. Description of Prior Art

With a rapid development of monitor types, novel and colorful monitors with high resolution, e.g., liquid crystal displays (LCDs), are indispensable components used in various electronic products such as monitors for notebook computers, personal digital assistants (PDAs), digital cameras, and projectors. The demand for the novelty and colorful monitors has increased tremendously. A Low Temperature Poly-Silicon Liquid Crystal Display (LTPS LCD) panel, on account of high resolution demands, is widely applied to various electronic devices.

Referring to FIG. 1 illustrating a functional block diagram of a conventional source driver, the source driver 10 comprises an output stage circuit 161, a digital-to-analog converter (DAC) 162, a level shift circuit 163, a latch 164, a data buffer 165, and a shift register 166. The shift register 166 is used for sequentially shifting an input impulse from an external circuit in response to a clock signal CLK. Data signals D00P/N-D02P/N, D10P/N-D102P/N, D20P/N-D22P/N are stored to the data buffer 165 through a bus based on the output from the shift register 166. The control signal STB is fed to the latch 164 and the output stage circuit 161. The latch 164 is used for latching the data signals D00P/N-D02P/N, D10P/N-D102P/N, D20P/N-D22P/N for a while and outputting the data signals D00P/N-D02P/N, D10P/N-D102P/N, D20P/N-D22P/N simultaneously. The level shift circuit 163 is used for raising voltage level of output of the latch 164. The DAC 162 can transform the digital data signal into an analog signal. While the control signal STB is at a raising edge, video data stream composed by the data signals is delivered from the data buffer 165 to the latch 164; alternatively, while the control signal is at a falling edge, the video data stream is fed to pixels of a liquid crystal panel via the output stage circuit 161.

Referring to FIG. 2, a functional block diagram of a conventional level shift circuit 163 is shown. At present, by using LTPS processes, circuits can be mounted on the glass. Nevertheless, it is a complex task for a designer to consider instabilities and variations among LTPS-manufactured elements, especially an impact of circuit quality attributed to threshold voltage ($V_{TH}$) of a transistor and electrons mobility rate ($\mu$). A conventional level shift 163 for raising voltage level of an input signal may occur a delay or erroneous operation owing to low-voltage input signal or poor transistor characteristics.

SUMMARY OF THE INVENTION

Accordingly, the present invention is directed to a method and a level shift circuit suppressing high threshold voltage of a transistor to enhance normal operative voltage range to overcome one or more of the problems due to limitations and disadvantages of the prior art.

Briefly summarized, a level shift circuit for adjusting voltage level of an input signal comprises a voltage dividing circuit for outputting a first voltage signal in response to the input signal, and a buffer coupled to a first node for generating a second voltage signal by adjusting voltage level of the first voltage signal. The voltage dividing circuit includes a first load coupled between the first node and the first supply voltage, and a second load coupled between the input signal and the first node.

In an aspect of the present invention, the first load and the second loads are resistance elements.

In another aspect of the present invention, the first load is a P-type metal oxide semiconductor (PMOS), of which a gate is coupled to a second supply voltage or a signal inversed to the input signal. The second load is an N-type metal oxide semiconductor (NMOS), of which a gate of the N-type metal oxide semiconductor is coupled to the first supply voltage.

According to the present invention, a level shift circuit for raising a voltage level of an input signal comprises a first inverter, a second inverter, a first level adjusting circuit, and a second level adjusting circuit, a first transistor, and a second transistor. The first inverter coupled to the first input signal is used for outputting a first voltage signal in response to the input signal. The first level adjusting circuit coupled to the first inverter is used for adjusting an average voltage level of the first voltage signal to a first voltage level. The second level adjusting circuit coupled to the first inverter is used for adjusting the average voltage level of the first voltage signal to a second voltage level. The first transistor comprises a gate coupled to the first level adjusting circuit, and a source coupled a first supply voltage. The second transistor comprises a gate coupled to the second level adjusting circuit, and a source coupled a second supply voltage. The second inverter is coupled to a drain of the first transistor and a drain of the second transistor.

In yet another aspect of the present invention, the level shift circuit further comprises a regulator coupled between the input signal and the first inverter for regulating a voltage level of the input signal. The regulator comprises a capacitor coupled between the first inverter and the input signal, a first resistance element coupled between the first inverter and the first supply voltage, and a second resistance element coupled between the first inverter and the second supply voltage.

These and other objectives of the present invention will become apparent to those of ordinary skill in the art after reading the following detailed description of the preferred embodiment that is illustrated in the various figures and drawings.

DETAILED DESCRIPTION OF THE PREFERRED EMBODIMENTS

Figure 1:
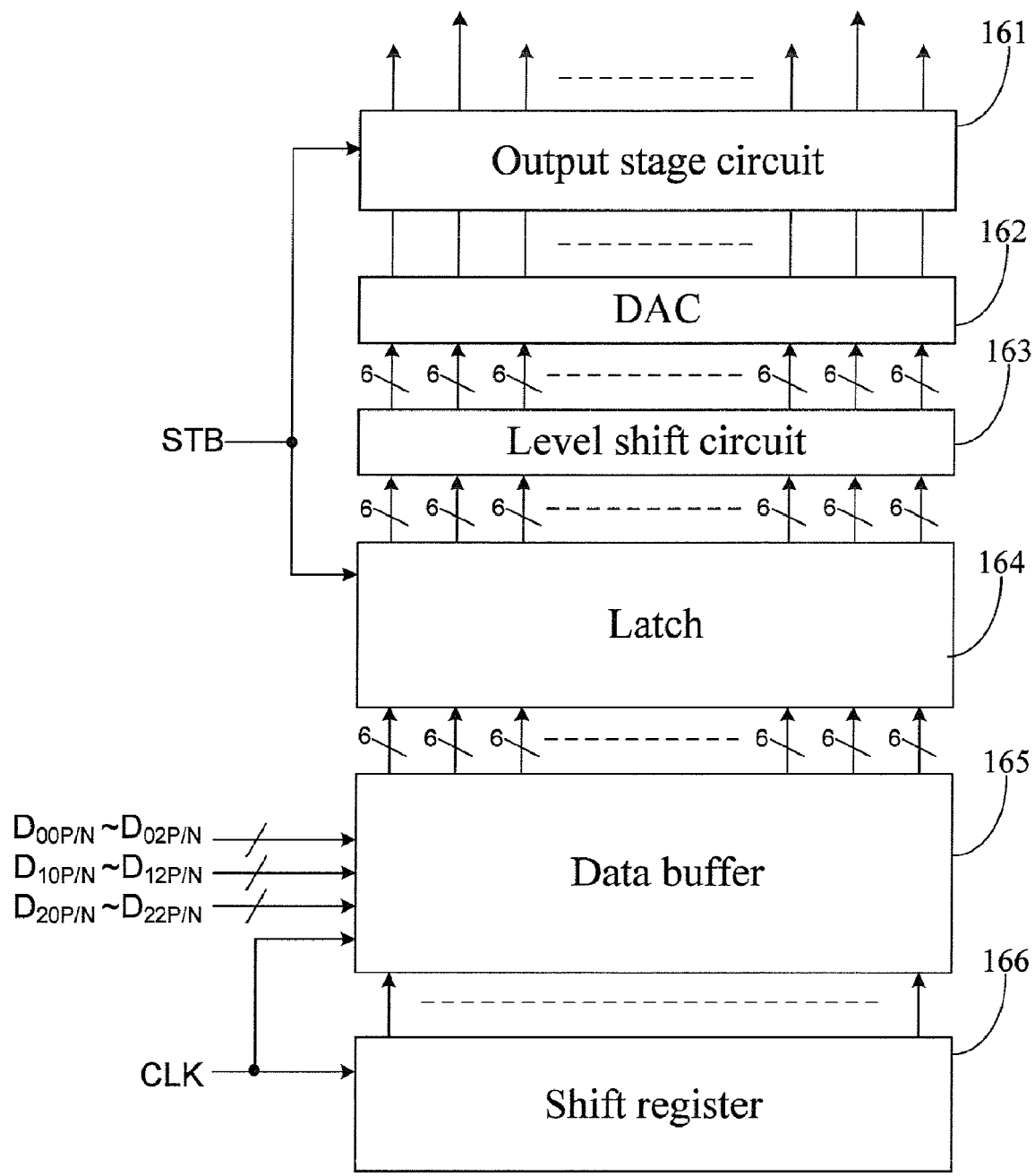
FIG. 1 illustrating a functional block diagram of a conventional source driver.
Figure 2:
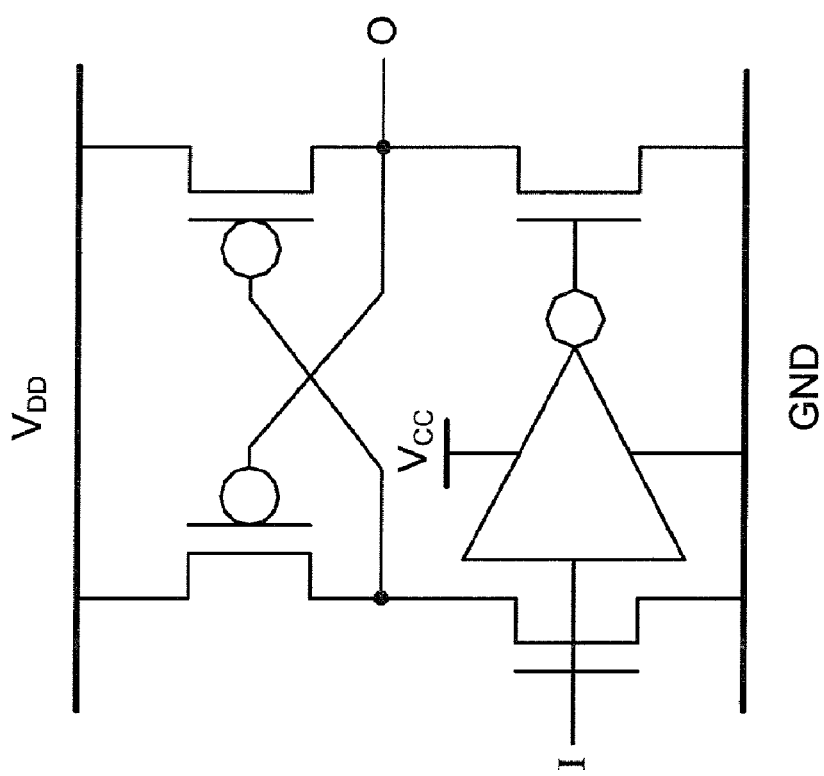
FIG. 2 shows a functional block diagram of a conventional level shift circuit.
Figure 3:
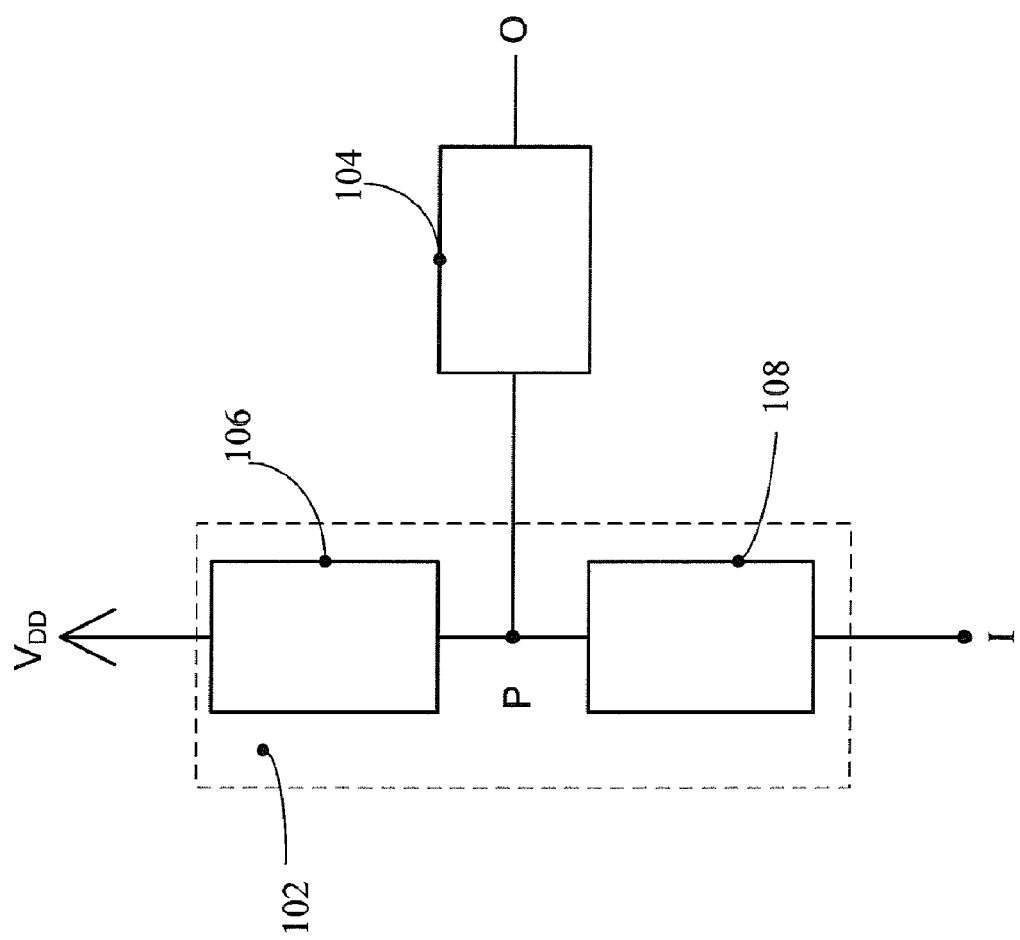
FIG. 3 shows a block diagram of a level shift circuit according to the preferred embodiment of the present invention.

Referring to FIG. 3 showing a block diagram of a level shift circuit 100 according to the preferred embodiment of the present invention, the level shift circuit 100 for raising voltage level of an input is applied in a source driver of a liquid crystal display (LCD) device. The level shift circuit 100 comprises a voltage dividing circuit 102 and a buffer circuit 104. The voltage dividing circuit 102 coupled to an input signal I is used for outputting a first voltage signal at a node P based on an input signal. The voltage dividing circuit 102 comprises a first load 106 coupled between a first supply voltage $V_{DD}$ and the first node P, and a second load 108 coupled between the input signal I and a first node P. The buffer circuit 104 coupled to the first node P is used for raising voltage level of the first voltage signal to output a second voltage signal at output signal O.

Figure 4:
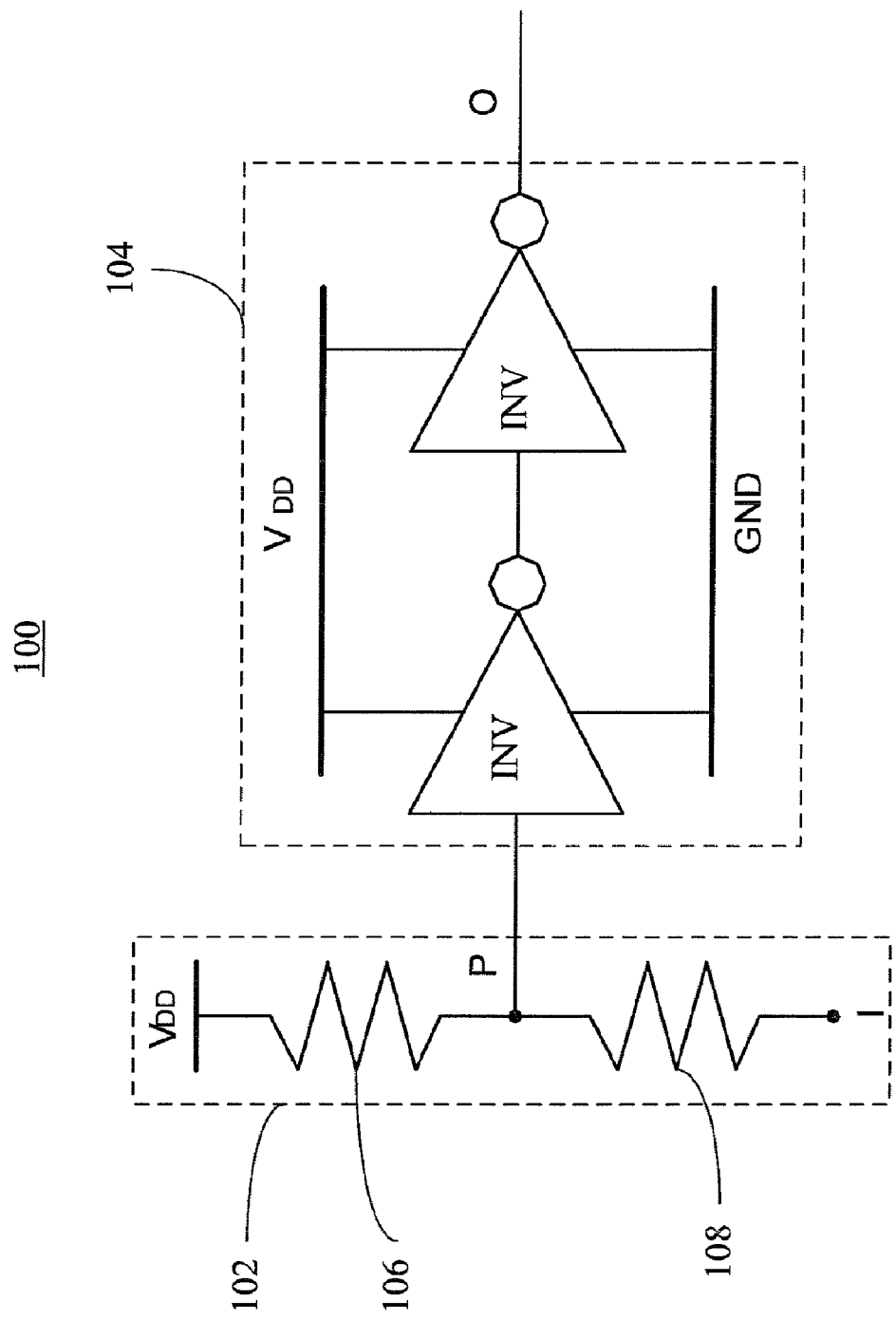
FIG. 4 is a diagram of equivalent circuit of the level shift circuit according to the first embodiment of the invention.
Figure 5:
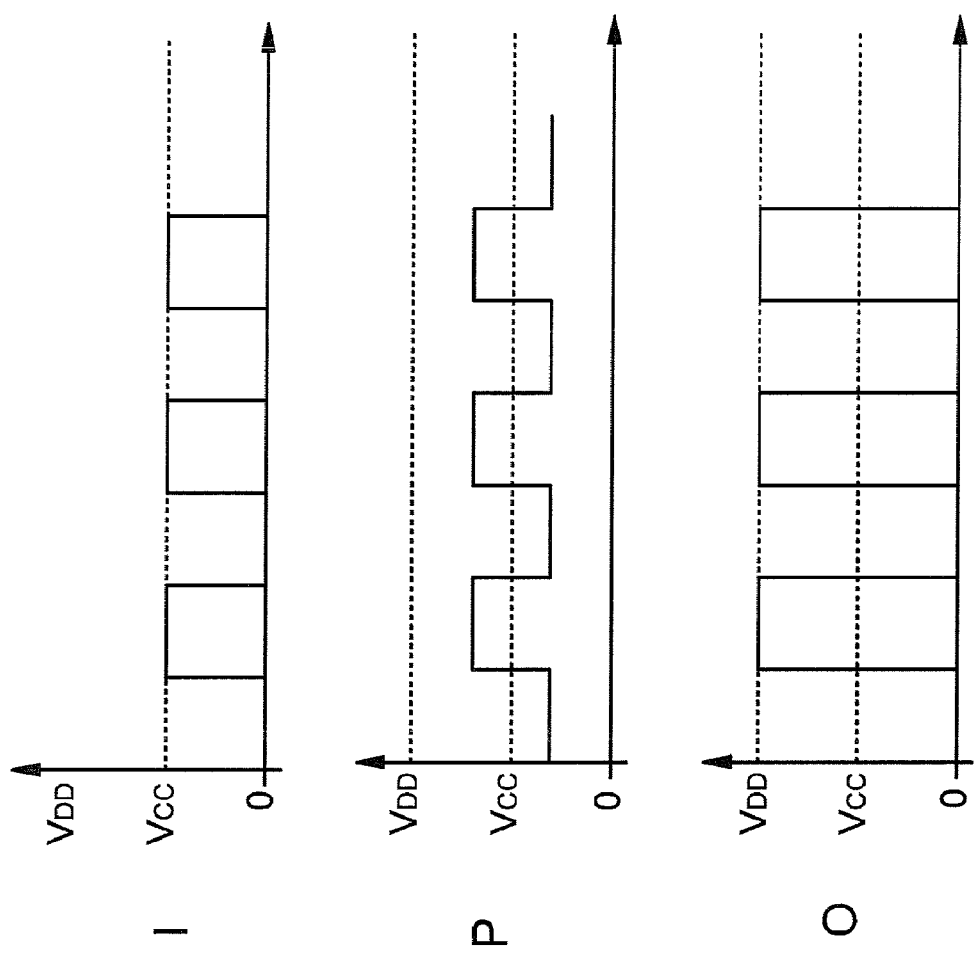
FIG. 5 is a waveform diagram of the level shift circuit as shown in FIG. 4.

Please refer to FIG. 4 and FIG. 5. FIG. 4 is a diagram of an equivalent circuit of the level shift circuit 100 according to the first embodiment of the invention. FIG. 5 is a waveform diagram of the level shift circuit 100. The level shift circuit 100 aims to enhance the transition edge between high voltage level and low voltage level of the input signal. For example, assuming that the high voltage level and the low voltage level of the input signal are Vcc and ground voltage GND, the level shift circuit 100 will aim to make a high voltage level and a low voltage level of the output $V_{DD}$ and ground voltage GND, respectively. The buffer circuit 104 comprises two inverters INV, each of which utilizes the supply voltage $V_{DD}$ as the maximum operational voltage, and the ground voltage GND as the minimum operational voltage. Both the first load 106 and the second load 108 are resistance loads in order to avoid an interference of the altered voltage level from the threshold voltage $V_{TH}$ of a transistor. The first voltage signal Vp and the first supply voltage $V_{DD}$ output at the node P are related to the input signal $V_I$. Their relation can be shown as:

$$V_P = \frac{R_1}{R_1 + R_2} V_{DD} + \frac{R_2}{R_1 + R_2} V_I \quad \text{Equation 1}$$

In other words, the high voltage level of the first voltage signal $V_P$ equals to $R_1/R_1+R_2(V_{DD}-V_{CC})+V_{CC}$, while the low voltage level of it equals to $R_1/R_1+R_2\,V_{DD}$. Finally, by the buffer circuit 104, the high and low voltage levels of the first voltage signal Vp are adapted to $V_{DD}$ and GND.

In design, the average voltage level of the first voltage signal $V_P$ at the node P has to be adjusted to $½V_{DD}$ in order that the high and low voltage levels of the final output of the buffer circuit 104 can be $V_{DD}$ and GND respectively. Since (the high voltage level of first voltage signal Vp)−(the average voltage level of first voltage signal Vp)=(the average voltage level of first voltage signal Vp)−(the low voltage level of first voltage signal Vp), $$\frac{1}{a+1}(V_{DD}-V_{CC})+V_{CC}-\frac{1}{2}V_{DD}=\frac{1}{2}V_{DD}-\frac{1}{a+1}V_{DD}$$

$$\Rightarrow a = \frac{1}{1-\frac{V_{CC}}{V_{DD}}},$$

where $a = \frac{R_2}{R_1}$, $R_1$ refers to the resistance of the first load 106 and $R_2$ the resistance of the second load 108.

Consequently, the relation between the first load 106 and the second load 108 is $$\frac{R_2}{R_1} = \frac{1}{1-\frac{V_{CC}}{V_{DD}}}.$$

Figure 6A:
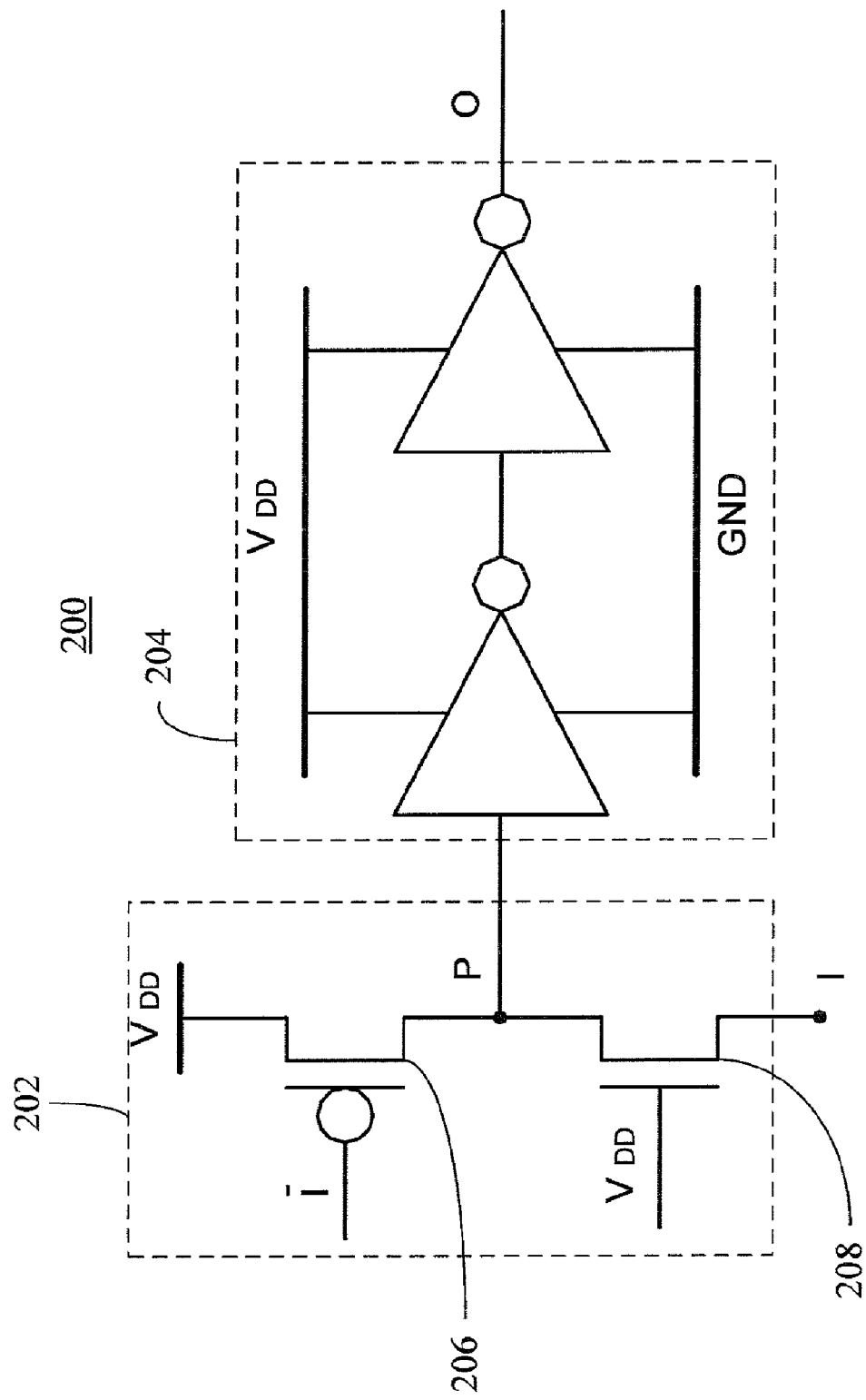
FIG. 6A is a diagram of equivalent circuit of a level shift circuit according to the second embodiment of the present invention.
Figure 7:
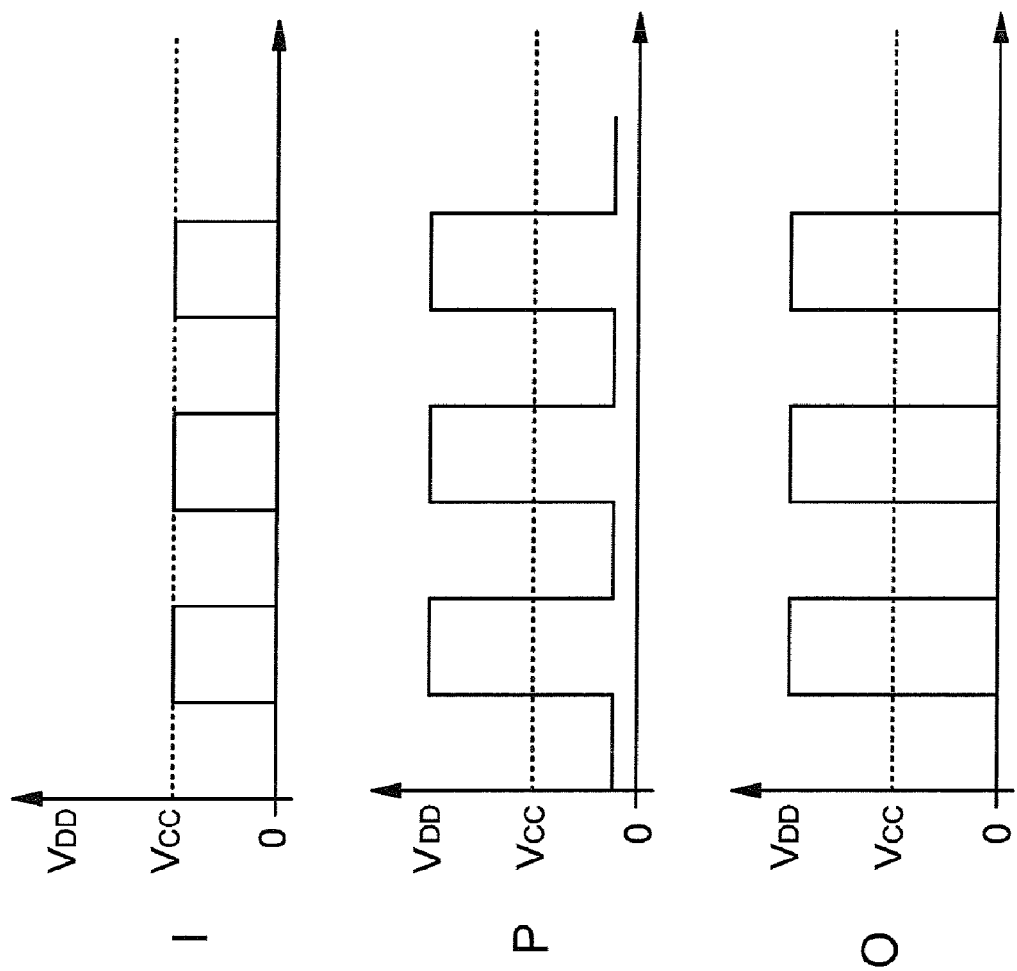
FIG. 7 is a waveform diagram of the level shift circuit as shown in FIGS. 6A and 6B.

Referring to FIG. 6A and FIG. 7, FIG. 6A is a diagram of an equivalent circuit of a level shift circuit 200 according to the second embodiment of the present invention, and FIG. 7 is a waveform diagram of the level shift circuit 200. A voltage dividing circuit 202 of the level shift circuit 200 comprises a first load and a second load. The first load is a P-type metal oxide semiconductor (PMOS) 206. The second load is an N-type metal oxide semiconductor (NMOS) 208. A source of the PMOS 206 is electrically connected to the supply voltage VDD, a gate of the PMOS 206 is electrically connected to the input signal in inversed phase, while a drain of the PMOS 206 is electrically connected to the node P. A drain of the NMOS 208 is electrically connected to the node P, a gate of the NMOS 208 electrically connected to the supply voltage VDD, while a source of the NMOS 208 is electrically connected to the input signal I. The buffer circuit 204 comprises two inverters INV and each of the inverter has the supply voltage VDD as the maximum operational voltage, and the ground voltage GND as the minimum operational voltage. The load 206 and load 208 of the voltage dividing circuit 202 are active loads, so the resistance of the PMOS 206 is $$R_P = \frac{1}{\mu_P C_{oxP}\left(\frac{W_p}{L_p}\right)(V_{SG}-V_{THp})},$$

wherein μP indicates hole mobility rate,

Wp indicates the width of the gate of the PMOS 206,

Lp indicates the length of the gate of the PMOS 206, $C_{oxP}$ indicates the unit capacitance of the gate oxide layer of PMOS 206, $V_{SG}$ indicates the voltage across the source and the gate, and $V_{THp}$ refers to the threshold voltage of PMOS 206.

Correspondingly, the resistance of the PMOS 208 is $$R_N = \frac{1}{\mu_n C_{oxN}\left(\frac{W_n}{L_n}\right)(V_{GS}-V_{THn})}$$

wherein $\mu_N$ indicates electron mobility rate, $W_N$ indicates the width of the gate of the NMOS 208, $L_N$ indicates the length of the gate of the NMOS 208, $C_{oxN}$ indicates the unit capacitance of the gate oxide layer of NMOS 208, $V_{GS}$ indicates the voltage across the gate and the source, and $V_{THp}$ indicates the threshold voltage of NMOS 208.

In other words, when $\mu_P$, $W_P$, $L_P$, $C_{oxP}$, $V_{THp}$, $\mu_N$, $W_N$, $L_N$, $C_{oxN}$ and $V_{THn}$ are constants, the resistance $R_P$ of PMOS 206 and the resistance $R_N$ of NMOS 208 change as a variation of the operational voltage, i.e. $V_{GS}$ (voltage across the gate and the source). For example, when the input signal I is at the high voltage level Vcc, and the inversed input signal Ī is at the low voltage level, the resistance $R_{PH}$ of the PMOS 206 turns to be at $$\frac{1}{\mu_P C_{oxP}\left(\frac{W_p}{L_p}\right)(V_{DD} - V_{THp})},$$

while the resistance $R_{NH}$ of the NMOS 208 turns to be at $$\frac{1}{\mu_n C_{oxN}\left(\frac{W_n}{L_n}\right)(V_{DD} - V_{CC} - V_{THn})}$$

On the contrary, when the input signal I is at the low voltage level GND, the inversed input signal Ī is at the high voltage level Vcc. As a result, the resistance $R_{PL}$ of the PMOS 206 turns to be at $$\frac{1}{\mu_P C_{oxP}\left(\frac{W_p}{L_p}\right)(V_{DD} - V_{CC} - V_{THp})},$$

while the resistance $R_{NL}$ of the NMOS 208 turns to be at $$\frac{1}{\mu_n C_{oxN}\left(\frac{W_n}{L_n}\right)(V_{DD} - V_{THn})}$$

In other words, the high voltage level of the first voltage signal $V_P$ equals $$\text{to } \frac{R_{NH}}{R_{PH} + R_{NH}}(V_{DD} - V_{CC}) + V_{CC},$$

while the low voltage level of it equals to $$\frac{R_{NL}}{R_{PL} + R_{NL}} V_{DD}.$$

By the buffer circuit 204, the high and low voltage levels of the first voltage signal $V_P$ are adapted to $V_{DD}$ and GND.

In design, the average voltage level of the first voltage signal $V_P$ at the node P has to be adjusted to $\frac{1}{2} V_{DD}$ in order that the high and low voltage levels of the final output of the buffer circuit 204 can be $V_{DD}$ and GND respectively. Since the high voltage level of Vp−the average voltage level of Vp=the average voltage level of Vp−the low voltage level of Vp, $$\frac{1}{a_H + 1}(V_{DD} - V_{CC}) + V_{CC} - \frac{1}{2}V_{DD} = \frac{1}{2}V_{DD} - \frac{1}{a_L + 1}V_{DD}$$

$$\text{where } a_H = \frac{R_{PH}}{R_{NH}}, a_L = \frac{R_{PL}}{R_{NL}}$$

$$\text{Consequently, } \frac{1 - \frac{1}{a_H + 1}}{\frac{1}{a_L + 1}} = \frac{1}{1 - \frac{V_{CC}}{V_{DD}}} \qquad \text{Equation 2}$$

$$\text{Besides, } a_H = \kappa \cdot a_L, \qquad \text{Equation 3}$$

where $\kappa =$ $$\frac{a_H}{a_L} = \frac{\frac{R_{PH}}{R_{NH}}}{\frac{R_{PL}}{R_{NL}}} = \frac{(V_{DD} - V_{CC} - V_{THp})(V_{DD} - V_{CC} - V_{THn})}{(V_{DD} - V_{THp})(V_{DD} - V_{THn})}$$

Finally, in accordance with Equation 2 and Equation 3, adjustments of length to width ratio of the gate of the PMOS 206 and NMOS 208 are required to form the voltage dividing circuit 202.

Figure 6B:
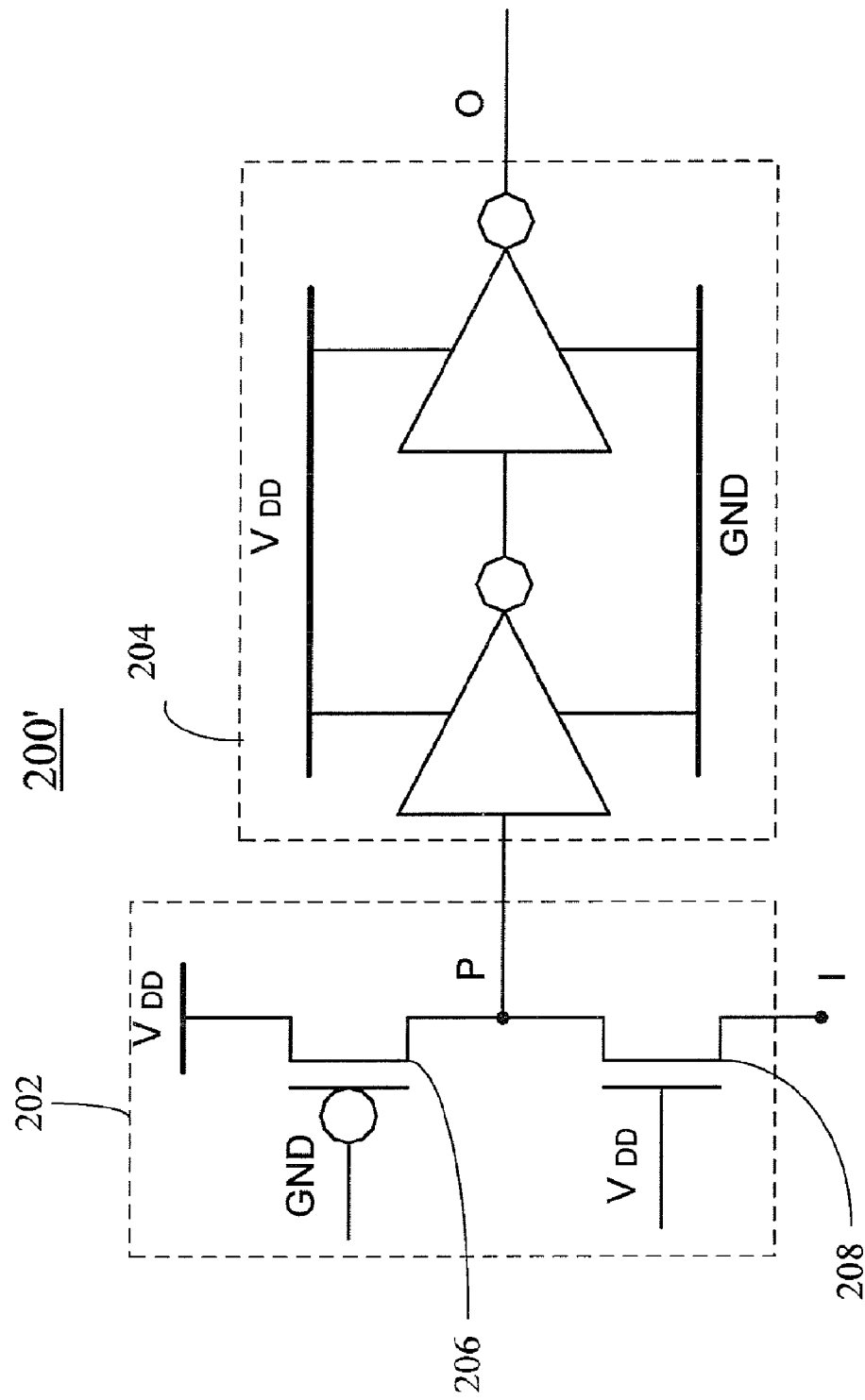
FIG. 6B shows an equivalent circuit diagram of a level shift circuit according to a third embodiment of the present invention.

Referring to FIG. 6B showing an equivalent circuit diagram of a level shift circuit according to a third embodiment of the present invention, for brevity, elements in FIG. 6B that have the same function as that illustrated in FIG. 6A are provided with the same reference numbers as those used in FIG. 6A. In addition to criteria of equations 2 and 3, the level shift circuit 200' comprises a PMOS 206 of which a gate is coupled to ground GND, instead of the inversed input signal Ī.

Figure 8:
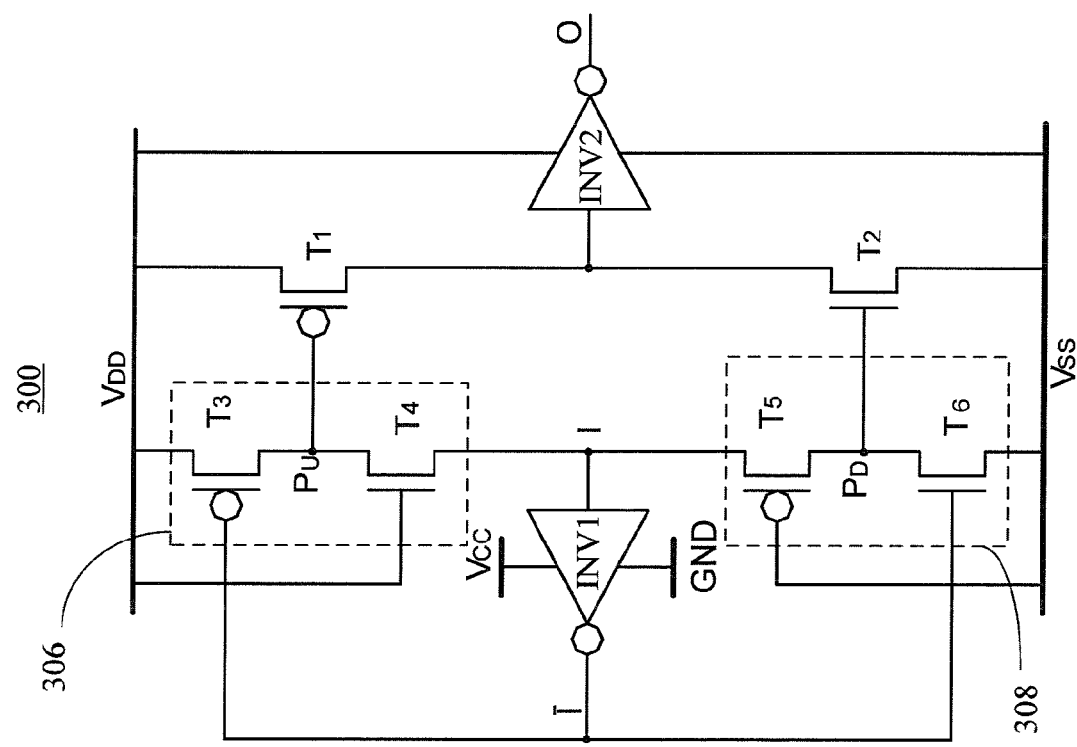
FIG. 8 shows an equivalent circuit diagram of a level shift circuit according to a fourth embodiment of the present invention.
Figure 9:
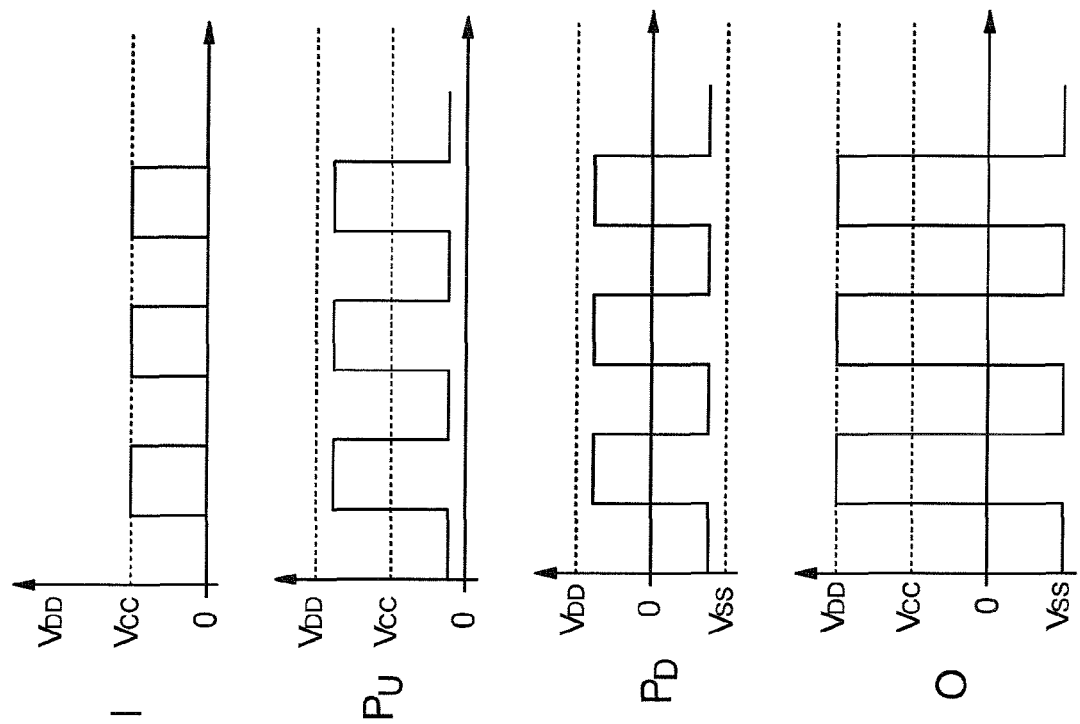
FIG. 9 illustrating a waveform diagram of the level shift circuit as shown in FIG. 8.

FIG. 8 shows an equivalent circuit diagram of a level shift circuit 300 according to a fourth embodiment of the present invention, and FIG. 9 illustrates a waveform diagram of the level shift circuit 300 as shown in FIG. 8 and FIG. 9. A first inverter INV1 is coupled to an input signal I for inversing the input signal I as an inversed input signal Ī (i.e. a first voltage signal). A first level adjusting circuit 306 coupled to the first inverter INV1 is used for adjusting an average voltage level the first voltage signal Ī to a first voltage level. A second level adjusting circuit 308 coupled to the second inverter INV2 is used for adjusting an average voltage level the first voltage signal Ī to a second voltage level. A gate and a source of the first transistor T1 are coupled to the first level adjusting circuit 306 and a first supply voltage $V_{DD}$ (e.g. 2 Vcc), respectively. A gate and a source of the first transistor T2 are coupled to the second level adjusting circuit 308 and a second supply voltage $V_{DD}$ (e.g. −Vcc), respectively. The second INV2 is coupled to drains of the transistors T1 and T2.

The first level adjusting circuit 306 comprises a third transistor T3 and a fourth transistor T4. The third transistor T3 may be a PMOS, and the fourth transistor T4 may be an NMOS. A gate, a source, and a drain of the transistor T3 are coupled to the first voltage signal Ī, the first supply voltage $V_{DD}$, and the gate of the transistor T1, respectively. A gate, a source, and a drain of the transistor T4 are coupled to the first supply voltage $V_{DD}$, the input signal I, and the gate of the transistor T1, respectively. The second level adjusting circuit 308 comprises a fifth transistor T5 and a sixth transistor T6. The fifth transistor T5 may be a PMOS, and the sixth transistor T6 may be an NMOS. A gate, a source, and a drain of the transistor T5 are coupled to the second supply voltage $V_{SS}$, the input signal I, and the gate of the transistor T2, respectively. A gate, a source, and a drain of the transistor T6 are coupled to the first voltage signal Ī, the second supply voltage $V_{SS}$, and the gate of the transistor T2, respectively.

The operational principle of the level shift circuit 300 is similar to the level shift circuit 200 as shown in FIG. 6A, or the level shift circuit 200' as shown in FIG. 6B. For instance, the first level adjusting circuit 306 and the inverter INV1 functioning as the voltage dividing circuit 200 as shown in FIG. 6A, is used for pulling up the average voltage level of the first voltage signal Ī to the first level Vcc (as depicted in waveform at node $P_U$ in FIG. 9). Correspondingly, the second level adjusting circuit 308 and the first inverter INV1 functioning as the voltage dividing circuit 200' as shown in FIG. 6B, is used for pulling down the average voltage level of the first voltage signal Ī to the second level (as depicted in waveform at node $P_D$ in FIG. 9). Thereafter, by means of the transistors T1, T2 and the second inverter INV2, the outputs of the first level adjusting circuit 306 and the second level adjusting circuit 308 are superposed to enhance the transition edge as 3 Vcc which is greater than that of the output of the level shift circuit, 2 Vcc.

Figure 10:
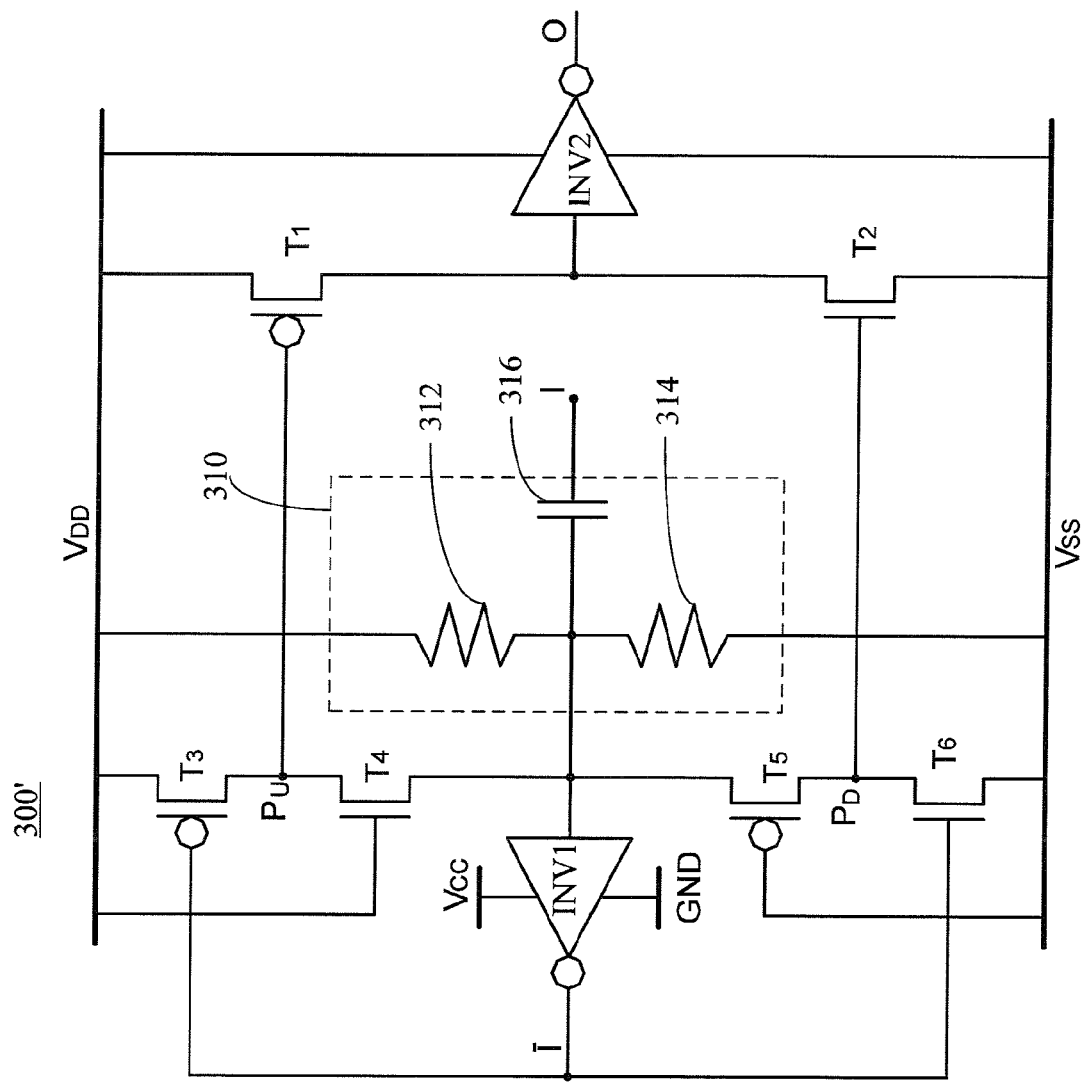
FIG. 10 shows an equivalent circuit diagram of a level shift circuit according to a fifth embodiment of the present invention.

Referring to FIG. 10 showing an equivalent circuit diagram of a level shift circuit 300' according to a fifth embodiment of the present invention, for brevity elements in FIG. 10 th at have the same function as that illustrated in FIG. 8 are provided with the same reference numbers as those used in FIG. 8. Differing from the level shift circuit 300, the level shift circuit 300' further comprises a regulator 310 coupled to the input signal I and the first inverter INV1 for regulating voltage level of the input signal I. The regulator 310 comprises a capacitor 316 coupled between the first inverter INV1 and the input signal I, a first resistance element 312 coupled between the first inverter INV1 and the first supply voltage $V_{DD}$, and a second resistance element 314 coupled between the first inverter INV1 and the second supply voltage $V_{SS}$.

Compared to the prior art, the traditional level shift circuit adopts the switch-on-off mode. As a result, conduction of a transistor is determined by the degree of the threshold voltage. The threshold voltage can be so high that the internal resistance of the switch increases and harms normal operation of the circuit. Conversely, the level shift circuit of the present invention adopts active loads to reduce the demand for the threshold voltage $V_{TH}$, and therefore the level shift circuit of the invention can alter stability of circuit operation and its speed.

As required, a detailed illustrative embodiment of the present invention is disclosed herein. However, techniques, systems and operating structures in accordance with the present invention may be embodied in a wide variety of forms and modes, some of which may be quite different from those in the disclosed embodiment. Consequently, the specific structural and functional details disclosed herein are merely representative, yet in that regard, they are deemed to afford the best embodiment for purposes of disclosure and to provide a basis for the claims herein, which define the scope of the present invention.

What is claimed is:

1. A level shift circuit for raising a voltage level of an input signal, comprising:
    a first inverter coupled to the first input signal for outputting a first voltage signal in response to the input signal;
    a first level adjusting circuit coupled to the first inverter for adjusting an average voltage level of the first voltage signal to a first voltage level;
    a second level adjusting circuit coupled to the first inverter for adjusting the average voltage level of the first voltage signal to a second voltage level;
    a first transistor comprising a gate coupled to the first level adjusting circuit, and a source coupled a first supply voltage;
    a second transistor comprising a gate coupled to the second level adjusting circuit, and a source coupled to a second supply voltage; and
    a second inverter coupled to a drain of the first transistor and a drain of the second transistor.

2. The level shift circuit of claim 1, wherein the first level adjusting circuit comprises a third transistor and a fourth transistor, the third transistor being a P-type metal oxide semiconductor (PMOS), and the fourth transistor being an N-type metal oxide semiconductor (NMOS).

3. The level shift circuit of claim 1, wherein a gate, a source, and a drain of the third transistor are coupled to the first voltage signal, the first supply voltage, and the gate of the first transistor, respectively, while a gate, a source, and a drain of the fourth transistor are coupled to the first supply voltage, the input signal, and the gate of the first transistor, respectively.

4. The level shift circuit of claim 1, wherein the second level adjusting circuit comprises a fifth transistor and a sixth transistor, the fifth transistor being a P-type metal oxide semiconductor (PMOS), and the sixth transistor being an N-type metal oxide semiconductor (NMOS).

5. The level shift circuit of claim 4, wherein a gate, a source, and a drain of the fifth transistor are coupled to the second supply voltage, the input signal, and the gate of the second transistor, respectively, while a gate, a source, and a drain of the sixth transistor are coupled to the first voltage signal, the second supply voltage, and the gate of the second transistor, respectively.

6. The level shift circuit of claim 1, further comprising a regulator coupled between the input signal and the first inverter for regulating a voltage level of the input signal.

7. The level shift circuit of claim 6, wherein the regulator comprises a capacitor coupled between the first inverter and the input signal, a first resistance element coupled between the first inverter and the first supply voltage, and a second resistance element coupled between the first inverter and the second supply voltage.

* * * * *